(12) United States Patent
Gao

(10) Patent No.: US 11,006,547 B2
(45) Date of Patent: May 11, 2021

(54) SOLUTION FOR PRECISION COOLING AND FLUID MANAGEMENT OPTIMIZATION IN IMMERSION COOLING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 50 days.

(21) Appl. No.: 16/292,221

(22) Filed: Mar. 4, 2019

(65) Prior Publication Data
US 2020/0288600 A1    Sep. 10, 2020

(51) Int. Cl.
*H05K 7/20* (2006.01)
*G06F 1/20* (2006.01)

(52) U.S. Cl.
CPC ........... *H05K 7/20236* (2013.01); *G06F 1/20* (2013.01); *H05K 7/20263* (2013.01); *H05K 7/20272* (2013.01); *H05K 7/20781* (2013.01)

(58) Field of Classification Search
CPC .......... H05K 7/20236; H05K 7/20263–20272; H05K 7/20772–20781
See application file for complete search history.

(56) References Cited

U.S. PATENT DOCUMENTS

| | | | | |
|---|---|---|---|---|
| 4,302,793 | A * | 11/1981 | Rohner | H05K 7/20272 174/15.1 |
| 10,194,559 | B2 * | 1/2019 | Saito | H05K 5/0026 |
| 10,225,951 | B2 * | 3/2019 | Fujiwara | H05K 7/203 |
| 10,356,958 | B2 * | 7/2019 | Inano | H05K 7/20781 |
| 10,542,635 | B2 * | 1/2020 | Nishiyama | H05K 7/20272 |
| 10,624,236 | B2 * | 4/2020 | Inano | H05K 7/20272 |
| 2016/0366792 | A1 * | 12/2016 | Smith | G06F 1/20 |
| 2017/0295676 | A1 * | 10/2017 | Conn | H05K 7/20236 |
| 2019/0357385 | A1 * | 11/2019 | Miyazaki | F28F 9/005 |
| 2020/0323108 | A1 * | 10/2020 | Bilan | H05K 7/1488 |

* cited by examiner

*Primary Examiner* — Zachary Pape
(74) *Attorney, Agent, or Firm* — Womble Bond Dickinson (US) LLP

(57) ABSTRACT

A data center immersion cooling system is described. The system comprises: an immersion tank; a heat exchanger to extract heat from heated coolant and transform heated coolant into cooled coolant; a coolant supply line to supply the cooled coolant from the heat exchanger to the immersion tank; and a coolant return line to return the heated coolant from the immersion tank to the heat exchanger, wherein the immersion tank further comprises: a plurality of equipment compartments that accommodate electronic devices; and a heated coolant reservoir disposed around the plurality of equipment compartments, wherein the cooled coolant enters the equipment compartments from the bottom, wherein the heated coolant in the equipment compartments exits the equipment compartments at the top, and is collected into the heated coolant reservoir, and wherein the heated coolant in the heated coolant reservoir is returned to the heat exchanger via the coolant return line. The heated coolant reservoir also provides a buffering function to the systems which is needed in several operating scenarios.

14 Claims, 4 Drawing Sheets

US 11,006,547 B2

SOLUTION FOR PRECISION COOLING AND FLUID MANAGEMENT OPTIMIZATION IN IMMERSION COOLING

FIELD OF THE INVENTION

Embodiments of the present invention relate generally to data centers. More particularly, embodiments of the invention relate to immersion cooling for data centers.

BACKGROUND

Immersion cooling is a computer cooling practice by which computer components such as central processing units (CPUs), graphics processing units (GPUs), memory, SSD and other electronics including complete servers are completely submerged in a thermally conductive dielectric liquid or coolant, which is then cooled through the use of a circulation system employing liquid pumps, plumbing, liquid-to-liquid heat exchangers and/or dry cooler (radiator) type coolers to reject the heat from the coolant.

Immersion cooling is suited to scenarios that require high power density thermal management. With the increasing power density (i.e., thermal design power) of processors such as CPUs and GPUs, thermal management can become a challenge. It can become even more challenging when multiple high density processors are packaged into one system (e.g., one server). Conventional air cooling solutions (e.g., with a heat sink or a heat pipe) may not be able to satisfy the cooling requirements in these scenarios, and immersion cooling may represent a promising solution.

However, several technical difficulties need to be solved before the immersion cooling-based solutions can be installed at a commercial scale. Some existing immersion cooling-based solutions are associated with drawbacks. For example, with some of these solutions, the heated coolant and the cooled coolant are not separated, and the coolant for different pieces of equipment is not separated. As a consequence, inefficient coolant management and poor thermal management may result. In particular, improper coolant return design may result in problems such as recirculation of the heated coolant, coolant bypass, internal coolant vortex, hot spot, and so on. The challenges relate to, for example, long term performance, long term reliability, compatibility between the electronics and the coolant, hardware design, and so on.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
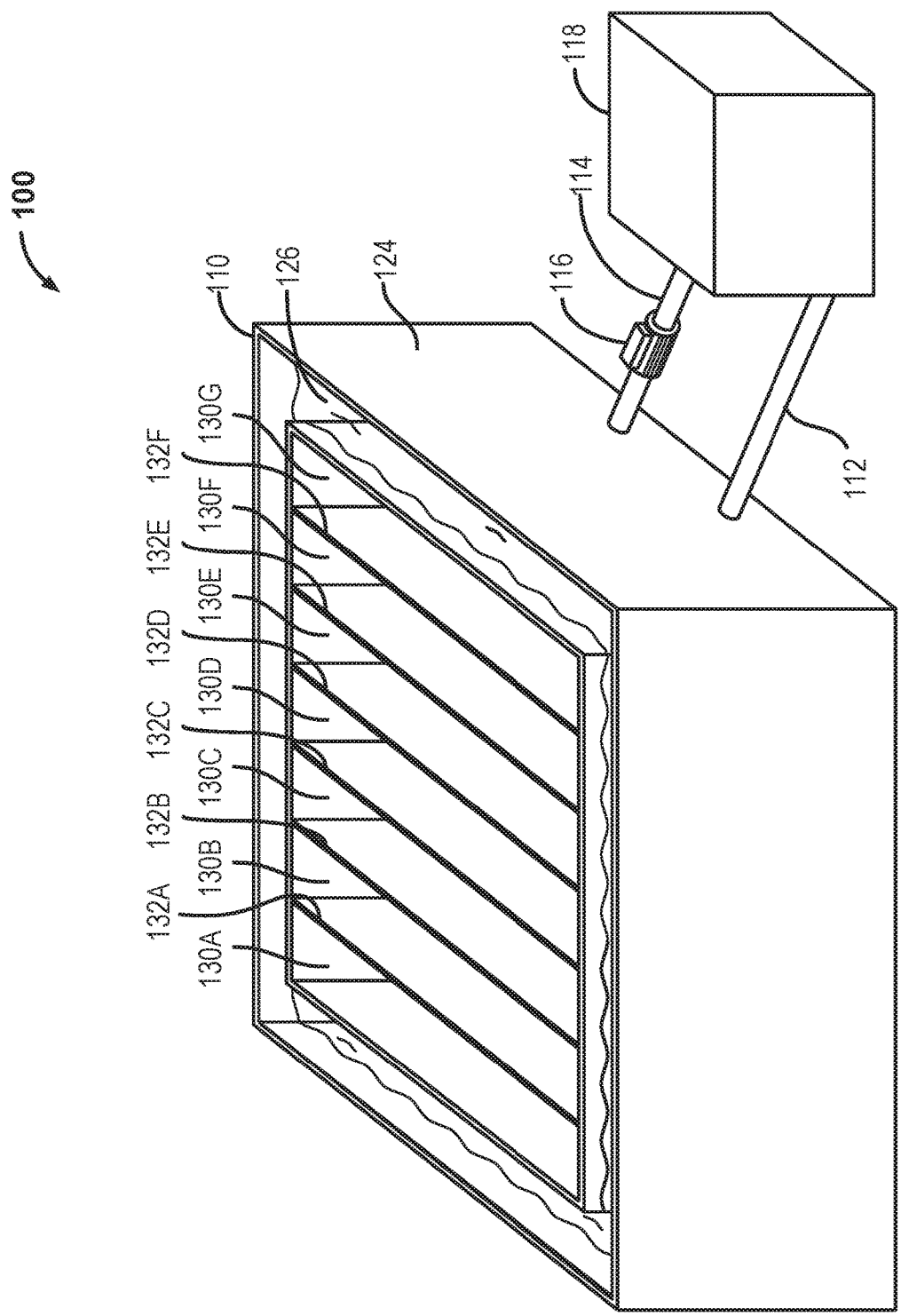
FIG. 1 is a block diagram illustrating an example of a data center system with immersion cooling according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the disclosure relate to an innovative immersion cooling tank design for precision cooling and coolant management optimization. Cooled liquid coolant may enter one or more equipment compartments from the bottom. As the coolant extracts heat from the electronics, the temperature of the coolant increases, and the coolant becomes less dense as a result. The hotter and less dense coolant tends to rise to the top within the equipment compartments. Accordingly, after cooling the equipment, the heated liquid coolant may exit the equipment compartments at the top. In one embodiment, before being returned to the heat exchanger, the heated coolant may be temporarily accumulated in a heated coolant reservoir disposed in the immersion tank after exiting the IT equipment compartments. Therefore, a full segregation between the supply liquid (i.e., the cooled coolant) and the return liquid (i.e., the heated coolant) within the immersion tank may be achieved.

In one embodiment, the immersion tank may include a number of equipment compartments that are separated from each other, such that the coolant may not circulate between different equipment compartments under normal operation conditions. Two neighboring or adjacent equipment compartments may be separated from each other by a wall, a panel, or any other suitable structure.

Accordingly, in embodiments of the disclosure, efficient coolant management is achieved. In particular, the cooled coolant and the heated coolant are separated from each other, and coolant short path or recirculation is eliminated. A simplified design for coolant supply and return is provided. The design is energy efficient because there is less resistance on the return side. Hot spots within the immersion tank are eliminated, as heated coolant that has exited from the equipment compartments is combined and collected in a heated coolant reservoir before being pumped back to the heat exchanger. Furthermore, the design is flexible because the equipment compartments can accommodate different types of electronic equipment (e.g., servers), which has different form factors (e.g., 1U, 2U and 4U). The design is especially suited to scenarios where the devices installed in different equipment compartments are associated with different power consumption profiles.

According to one aspect of the disclosure, an immersion cooling unit includes at least one immersion tank or immersion container, a coolant supply line, and a coolant return line. The coolant return line is configured to return the warmer coolant from the immersion tank to the heat exchanger. The coolant supply line is to supply cooler coolant (e.g., cooling liquid) from a heat exchanger to the immersion tank. The heat exchanger is configured to extract the heat from warmer coolant received from the immersion tank via the coolant return line, which in turn transforms the warmer coolant to cooler coolant.

In one embodiment, the immersion tank includes one or more equipment compartments to contain or store one or more electronic devices (e.g., server blades) submerged into the coolant contained therein. A coolant reservoir is formed in the space between the equipment compartments and the immersion tank. The cooler coolant enters the equipment compartment from the bottom, traveling through the space of the equipment compartments upwardly to exchange the heat generated from the electronic devices and to transform into warmer coolant. The warmer coolant exits the equipment compartments at the top and spills and enters into the coolant reservoir. The warmer coolant is then removed from the bottom of the coolant reservoir and returned back to the heat exchanger via the coolant return line. Therefore, the hotter coolant is cumulated and pumped back to the heat exchanger instead of being pumped back directly.

In one embodiment, the immersion tank further includes one or more separators or walls to separate any adjacent equipment compartments to prevent the coolant from circulating between the adjacent equipment compartments. Each of the equipment compartments may be configured with the same dimension (e.g., height and/or width) and configuration. The liquid level in the coolant reservoir may be maintained below the height of the equipment compartments, such that the coolant in the coolant reservoir is prevented from circulating back into any of the equipment compartments. The separators may have the same height or higher than the walls of the equipment compartments, such that the coolant is prevent from entering an adjacent equipment compartment.

According to another aspect of the disclosure, a data center cooling system includes an array of one or more immersion cooling units coupled to a heat exchanger. Each of the immersion cooling units includes at least some of the components as described above.

FIG. 1 shows an example of an immersion cooling unit according to one embodiment. Referring to FIG. 1, the immersion cooling unit may be one of the immersion units arranged within a data center. According to one embodiment, the immersion cooling unit includes at least one immersion tank or immersion container, a coolant supply line, and a coolant return line. The coolant return line is configured to return the warmer coolant from the immersion tank to the heat exchanger. The coolant supply line is to supply cooler coolant (e.g., cooling liquid) from a heat exchanger to the immersion tank. The heat exchanger is configured to extract the heat from warmer coolant received from the immersion tank via the coolant return line, which in turn transforms the warmer coolant to cooler coolant.

In one embodiment, the immersion tank includes one or more equipment compartments to contain or store one or more electronic devices submerged into the coolant contained therein. The coolant can be any dielectric coolant suitable for immersion cooling. An electronic device can be a data processing system such as a server having at least one processor, memory, storage device, and/or network interface, etc. A server can be a Web server, an application server, or a backend server that is configured to provide data services to a variety of clients over a network (e.g., Internet). These components may generate heat during the normal operations. A coolant reservoir is formed in the space between the equipment compartments and the immersion tank. The cooler coolant enters the equipment compartment from the bottom, traveling through the space of the equipment compartments upwardly to exchange the heat generated from the electronic devices/components and to transform into warmer coolant. The warmer coolant exits the equipment compartments at the top and spills and enters into the hot coolant reservoir. The warmer coolant is then removed from the bottom of the coolant reservoir and returned back to the heat exchanger via the coolant return line. In addition, the hot coolant reservoir functions as a buffer tank, providing a buffer function for the immersion fluid loop. The system pressure may vary due to the variations in fluid temperature, in this case, the buffer tank provides a function of maintaining the system pressure.

Figure 2:
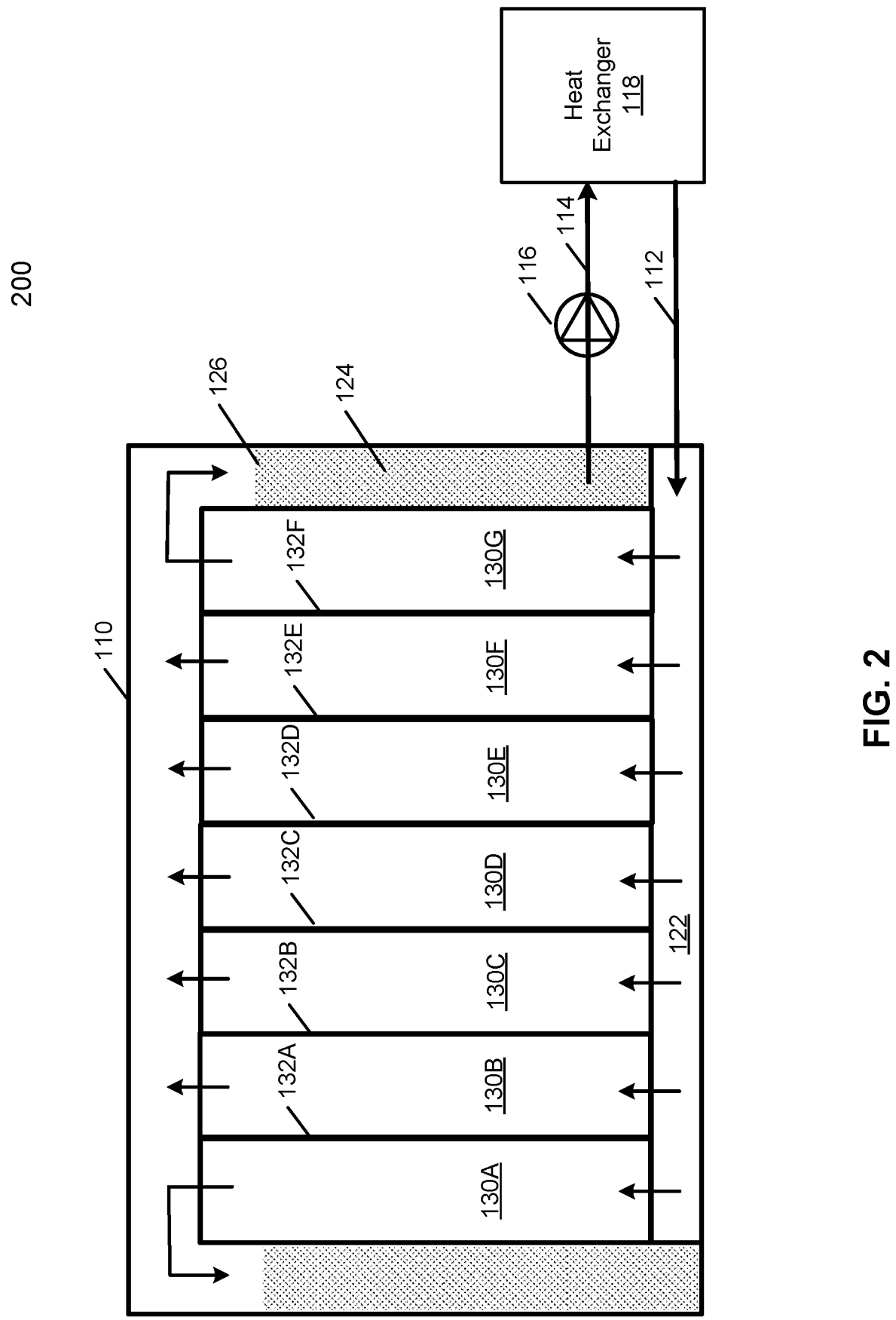
FIG. 2 is a block diagram illustrating an example of a data center system with immersion cooling according to one embodiment.

Referring to FIGS. 1 and 2, block diagrams illustrating an example of a data center system 100, 200 with immersion cooling according to one embodiment are shown. FIGS. 1 and 2 relate to the same embodiment, but are illustrated from different perspectives. The coolant supply line 112 supplies cooled liquid coolant to the immersion tank 110. The equipment compartments 130A-130G of a uniform height are arranged such that the cooled coolant enters the equipment compartments 130A-130G from the bottom side. It should be appreciated that the number of equipment compartments 130A-130G is illustrative and does not limit the disclosure. Separator walls 132A-132F are provided to separate any two neighboring equipment compartments 130A-130G. The separator walls 132A-132F are of a uniform height, and may be of the same height as the other walls that compose the equipment compartments 130A-130G. A heated coolant reservoir 124 (also simply referred to as a coolant reservoir) is disposed around the equipment compartments 130A-130G inside the immersion tank 110. Under normal operation conditions, the liquid level in the heated coolant reservoir 124 is lower than the height of the equipment compartments 130A-130G. Accordingly, after cooling the devices installed inside the equipment compartments 130A-130G, the heated liquid coolant exits (e.g., overflows or spill from) the equipment compartments 130A-130G at the top, and is collected in the heated coolant reservoir 124 before being returned to the heat exchanger 118. A coolant return line 114 is provided to return the heated or warmer coolant from the heated coolant reservoir 124 to the heat exchanger 118. A liquid pump 116 may be disposed on the coolant return line 114 to facilitate the return of the heated coolant. The heat exchanger 118 may be a liquid-to-liquid heat exchanger (e.g., a coolant distribution unit "CDU"), a liquid-to-air heat exchanger, or any other suitable type of heat exchanger that can effectively remove the heat from the heated coolant. The coolant that has been cooled in the heat exchanger 118 is then sent back to the immersion tank 110 via the coolant supply line 112, completing the loop.

Liquid return line 114 may be disposed at a lower or bottom portion of coolant reservoir 124. As a result, the warmer coolant travels upwardly within the equipment compartments 130A-130G, flows downwardly within the coolant reservoir 124, and exits the immersion tank 110 at the lower part or bottom of the immersion tank 110 back to heat exchanger 118 via liquid return line 1114.

As shown in FIG. 2, because the liquid level 126 in the heated coolant reservoir 124 is designed to be lower than the height of the equipment compartments 130A-130G, the heated/warmer coolant that has exited the equipment compartments 130A-130G cannot recirculate back into the equipment compartments 130A-130G.

Figure 3:
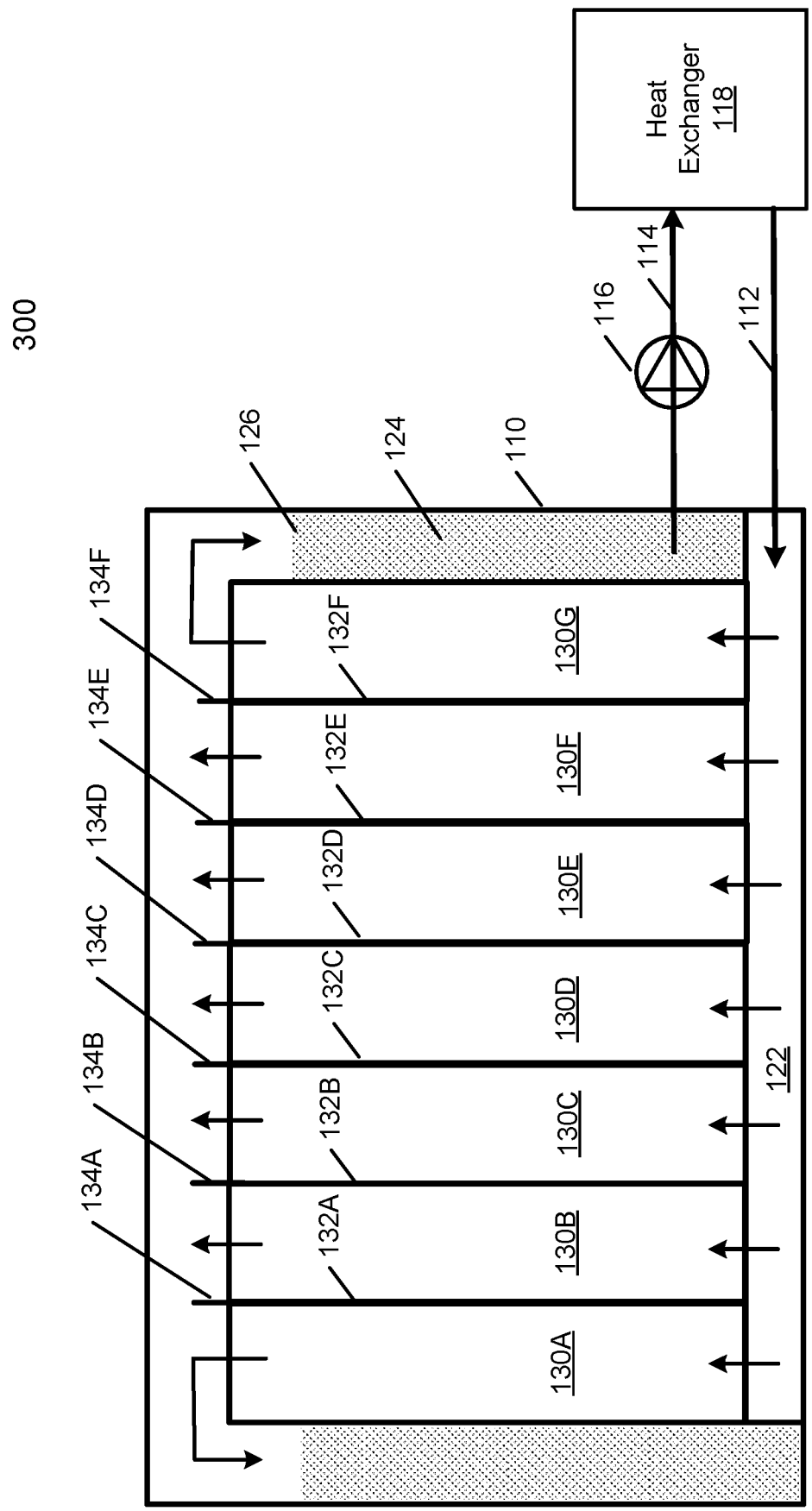
FIG. 3 is a block diagram illustrating an example of a data center system with immersion cooling according to one embodiment.

Referring to FIG. 3, a block diagram illustrating an example of a data center system 300 with immersion cooling according to one embodiment is shown. FIG. 3 is similar to FIG. 2, and the same elements that have been described with reference to FIG. 2 are not described here again. FIG. 3 is different from FIG. 2 in that the separator walls 132A-132F are higher than the other walls that compose the equipment compartments 130A-130G to ensure that the heated coolant that has overflown from one of the equipment compartments 130A-130G cannot enter an adjacent equipment compartment and can only enter the heated coolant reservoir 124. In one embodiment, to increase the height of the separator walls 132A-132F, extenders (e.g., blanking panels) 134A-134F may be installed on the top of the original separator walls 132A-132F. In one embodiment, extenders 134A-134F are installed only on the separator walls that are associated with equipment compartments that are occupied (i.e., the equipment compartments in which devices are actually installed).

Figure 4:
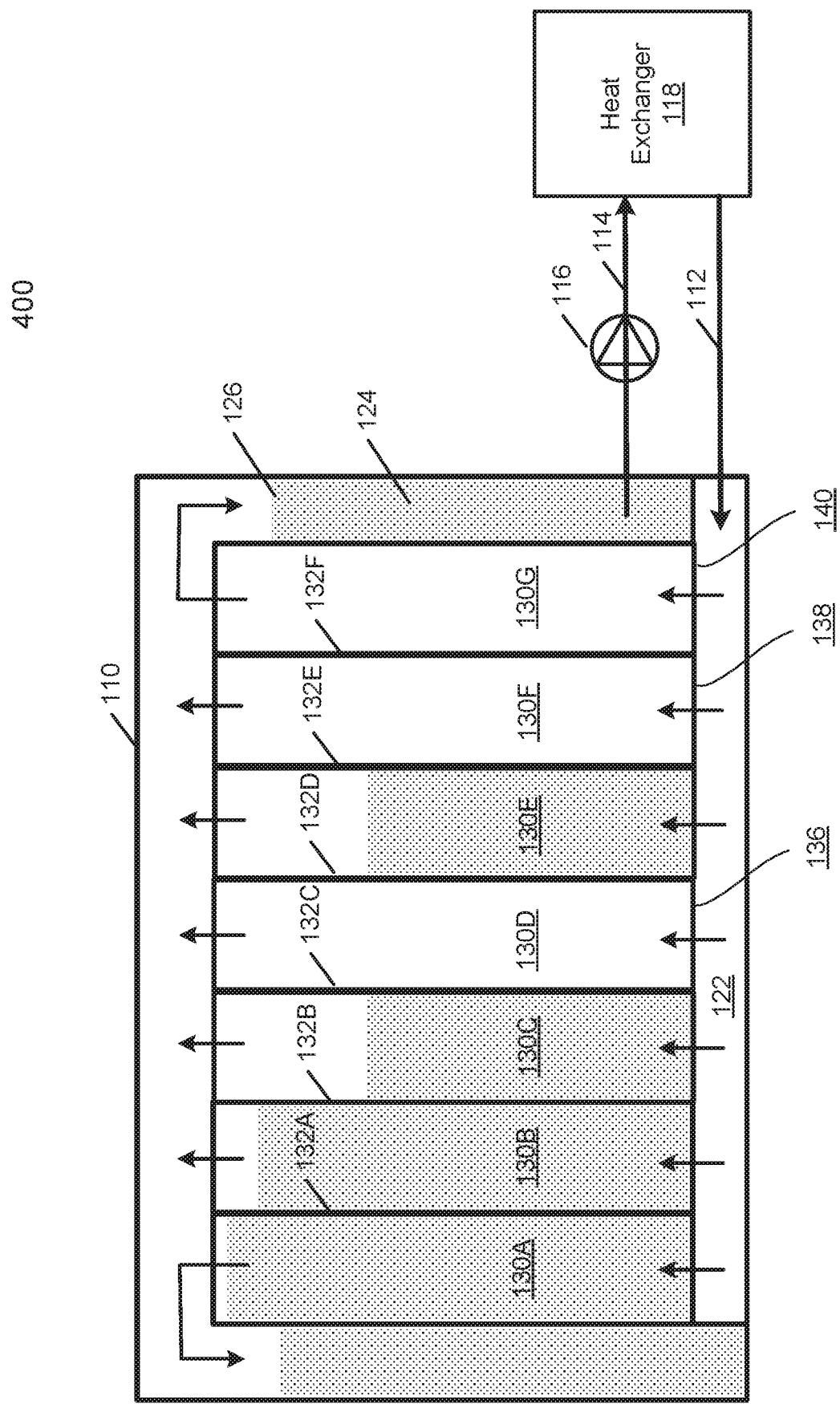
FIG. 4 is a block diagram illustrating an example of a data center system with immersion cooling according to one embodiment.

Referring to FIG. 4, a block diagram illustrating an example of a data center system 400 with immersion cooling according to one embodiment is shown. FIG. 4 is similar to FIG. 2, and the same elements that have been described with reference to FIG. 2 are not described here again. FIG. 4 is different from FIG. 2 in that the cooled coolant is prevented from entering the equipment compartments 130E-130G that are not occupied by an electronic device. In other words, the coolant only flows through the equipment compartments 130A-130D that are occupied. To prevent coolant from entering an unoccupied equipment compartment, in one embodiment, a blocking panel (e.g., blocking panels 136, 138, and 140) may be installed at the bottom of the unoccupied equipment compartment. In this design, the amount of fluid within the IT compartment 130 may vary due to actual numbers of IT equipment installed, in these scenarios, the coolant reservoir 124 also functions as the fluid buffer tank. As an example, when more IT equipment is installed, fluid level 126 is lower, when less IT equipment is installed, fluid level 126 is higher.

In one embodiment, the volume and/or coolant flow rate of each of the coolant entering the equipment compartments can be individually or independently controlled, for example, using a respective flow control logic or flow control device. The flow control device might assembled on the IT equipment. Or in the scenarios of multiple immersion tank 110, the fluid flow rate can be adjusted due to the tank heat density. Each electronic device may have a different workload and may generate a different amount of heat during the operations. By individually control the coolant volume and flow rate, the temperature of each equipment compartment can be individually controlled (e.g., using a temperature sensor and/or workload calculator) to prevent a hot spot of a particular equipment compartment. Of course, other suitable means for preventing the coolant from entering an unoccupied equipment compartment may also be utilized.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling unit, comprising:
    an immersion tank;
    a coolant supply line to supply cooled coolant from a heat exchanger to the immersion tank, wherein the heat exchanger is configured to extract heat from heated coolant and transform the heated coolant into the cooled coolant; and
    a coolant return line to return the heated coolant from the immersion tank to the heat exchanger, wherein the immersion tank includes:
        a plurality of equipment compartments to contain a plurality of electronic devices respectively,
        one or more separator walls to separate any neighboring equipment compartments of the plurality of equipment compartments to prevent the cooled coolant or the heated coolant from circulating between any neighboring equipment compartments, wherein the separator walls are higher than other walls that compose the plurality of equipment compartments, such that the heated coolant that has exited from any of the plurality of equipment compartments at the top is prevented from entering an adjacent equipment compartment, and
        a heated coolant reservoir disposed around the plurality of equipment compartments,
        wherein subsequent to being supplied to the immersion tank, the cooled coolant enters the equipment compartments from a bottom of the equipment compartments, extracts heat generated from the electronic devices, and is transformed into the heated coolant, wherein the heated coolant in the equipment compartments exits the equipment compartments at a top of the equipment compartments and enters into the heated coolant reservoir, wherein a liquid level in the heated coolant reservoir is below a height of the plurality of equipment compartments, such that the heated coolant in the heated coolant reservoir is prevented from circulating back into any of the plurality of equipment compartments, and wherein the heated coolant in the heated coolant reservoir is returned to the heat exchanger via the coolant return line.

2. The immersion cooling unit of claim 1, wherein each of the plurality of equipment compartments are of a same height.

3. The immersion cooling unit of claim 1, wherein each of the higher separator walls comprises an extender installed at the top of the equipment compartments.

4. The immersion cooling unit of claim 1, wherein the cooled coolant is prevented from entering any of the plurality of equipment compartments that are unoccupied.

5. The immersion cooling unit of claim 4, wherein a blocking panel is installed at the bottom of any of the plurality of equipment compartments that are unoccupied to prevent the cooled coolant from entering.

6. The immersion cooling unit of claim 1, wherein the heat exchanger is a liquid-to-liquid heat exchanger or a liquid-to-air heat exchanger.

7. The immersion cooling unit of claim 1, further comprising a liquid pump disposed on the coolant return line.

8. A data center cooling system, comprising:
    a heat exchanger; and
    a plurality of immersion cooling units coupled to the heat exchanger, wherein each of the immersion cooling unit comprises
        an immersion tank;
        a coolant supply line to supply cooled coolant from the heat exchanger to the immersion tank, wherein the heat exchanger is configured to extract heat from heated coolant and transform the heated coolant into the cooled coolant; and
        a coolant return line to return the heated coolant from the immersion tank to the heat exchanger, wherein the immersion tank includes:

a plurality of equipment compartments to contain a plurality of electronic devices respectively, one or more separator walls to separate any neighboring equipment compartments of the plurality of equipment compartments to prevent the cooled coolant or heated coolant from circulating between any neighboring equipment compartments, wherein the separator walls are higher than other walls that compose the plurality of equipment compartments, such that the heated coolant that has exited from any of the plurality of equipment compartments at the top is prevented from entering an adjacent equipment compartment, and a heated coolant reservoir disposed around the plurality of equipment compartments, wherein subsequent to being supplied to the immersion tank, the cooled coolant enters the equipment compartments from a bottom of the equipment compartments, extracts heat generated from the electronic devices, and is transformed into the heated coolant, wherein the heated coolant in the equipment compartments exits the equipment compartments at a top of the equipment compartments and enters into the heated coolant reservoir, wherein a liquid level in the heated coolant reservoir is below a height of the plurality of equipment compartments, such that the heated coolant in the heated coolant reservoir is prevented from circulating back into any of the plurality of equipment compartments, and wherein the heated coolant in the heated coolant reservoir is returned to the heat exchanger via the coolant return line.

9. The data center cooling system of claim 8, wherein each of the plurality of equipment compartments are of a same height.

10. The data center cooling system of claim 8, wherein each of the higher separator walls comprises an extender installed at the top of the equipment compartments.

11. The data center cooling system of claim 8, wherein the cooled coolant is prevented from entering any of the plurality of equipment compartments that are unoccupied.

12. The data center cooling system of claim 11, wherein a blocking panel is installed at the bottom of any of the plurality of equipment compartments that are unoccupied to prevent the cooled coolant from entering.

13. The data center cooling system of claim 8, wherein the heat exchanger is a liquid-to-liquid heat exchanger or a liquid-to-air heat exchanger.

14. The data center cooling system of claim 8, further comprising a liquid pump disposed on the coolant return line.

* * * * *